(12) United States Patent
Nilsson

(10) Patent No.: US 11,450,138 B2
(45) Date of Patent: Sep. 20, 2022

(54) UNDER DISPLAY BIOMETRIC IMAGING ARRANGEMENT

(71) Applicant: Fingerprint Cards AB, Gothenburg (SE)

(72) Inventor: René Nilsson, Eslöv (SE)

(73) Assignee: FINGERPRINT CARDS ANACATUM IP AB, Gothenburg (SE)

( * ) Notice: Subject to any disclaimer, the term of this patent is extended or adjusted under 35 U.S.C. 154(b) by 0 days.

(21) Appl. No.: 17/286,937

(22) PCT Filed: Oct. 8, 2019

(86) PCT No.: PCT/SE2019/050982
§ 371 (c)(1),
(2) Date: Apr. 20, 2021

(87) PCT Pub. No.: WO2020/085972
PCT Pub. Date: Apr. 30, 2020

(65) Prior Publication Data
US 2021/0374379 A1 Dec. 2, 2021

(30) Foreign Application Priority Data
Oct. 26, 2018 (SE) ...................... 1851329-1

(51) Int. Cl.
*H01L 27/14* (2006.01)
*G06V 40/13* (2022.01)
*H01L 27/146* (2006.01)

(52) U.S. Cl.
CPC .... *G06V 40/1318* (2022.01); *H01L 27/14621* (2013.01); *H01L 27/14627* (2013.01)

(58) Field of Classification Search
CPC ............ G06K 9/0004; H01L 27/14621; H01L 27/14627
See application file for complete search history.

(56) References Cited

U.S. PATENT DOCUMENTS

2015/0331279 A1* 11/2015 Kimura ................ G02B 5/201
349/42
2016/0266695 A1 9/2016 Bae et al.
(Continued)

FOREIGN PATENT DOCUMENTS

CN 107004130 A 8/2017
EP 3267359 A1 1/2018
(Continued)

OTHER PUBLICATIONS

PCT International Search Report and Written Opinion dated Dec. 11, 2019 for International Application No. PCT/SE2019/050982, 9 pages.

(Continued)

*Primary Examiner* — Kevin K Pyo
(74) *Attorney, Agent, or Firm* — RMCK Law Group, PLC

(57) ABSTRACT

An optical biometric imaging arrangement configured to be arranged under an at least partially transparent display panel, and configured to capture an image of an object located on an opposite side of the display panel, comprising: an image sensor comprising a photodetector pixel array; an array of light redirecting elements, each light redirecting element is configured to redirect light onto the pixel array, a color filter arranged between the array of light redirecting elements and the image sensor, the color filter comprising at least two color filter arrays of respective color filter elements being optically transmissive, a first color array comprising first color filter elements and a second color array comprising second color filter elements, the color filter arrays are arranged such that each photodetector pixel is at least partly covered by at least a first and a second color filter element.

20 Claims, 9 Drawing Sheets

(56) References Cited

U.S. PATENT DOCUMENTS

| | | |
|---|---|---|
| 2017/0126982 A1 | 5/2017 | Suh et al. |
| 2017/0220844 A1 | 8/2017 | Jones et al. |
| 2017/0357840 A1 | 12/2017 | Chen et al. |
| 2018/0047776 A1 | 2/2018 | Suzuki et al. |
| 2018/0158877 A1 | 6/2018 | Zeng et al. |
| 2020/0019745 A1* | 1/2020 | Kang .................. A61B 5/1172 |

FOREIGN PATENT DOCUMENTS

| | | |
|---|---|---|
| WO | 03098940 A1 | 11/2003 |
| WO | 2008131313 A2 | 10/2008 |
| WO | 2017214582 A1 | 12/2017 |

OTHER PUBLICATIONS

Extended European Search Report dated Nov. 15, 2021 for European Patent Application No. 19876542.2, 11 pages.
Qi, H. et al., "A Hand-held Mosaicked Multispectral Imaging Device for Early Stage Pressure Ulcer Detection," Journal of Medical Systems, vol. 35, No. 5, May 9, 2010, pp. 895-904.

* cited by examiner

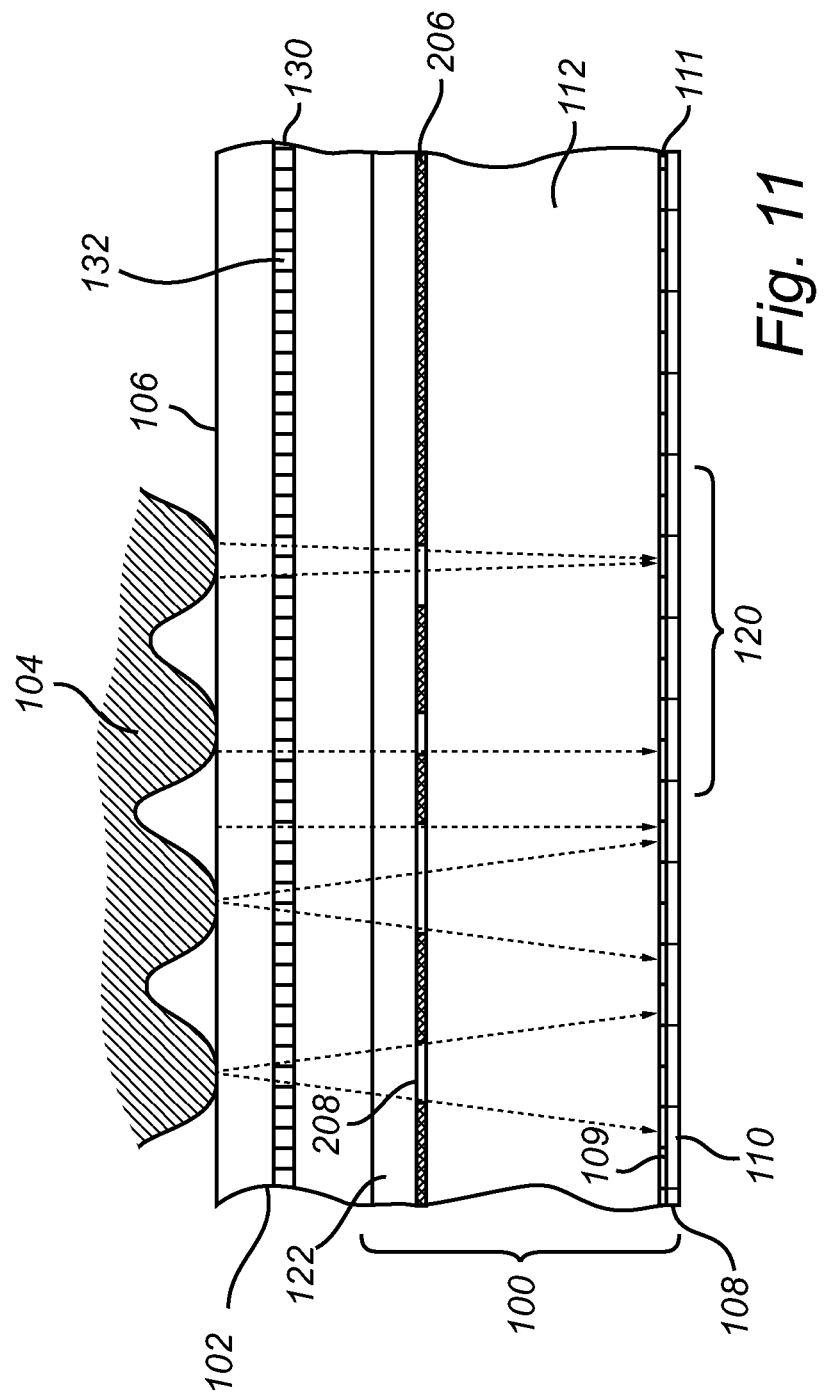

UNDER DISPLAY BIOMETRIC IMAGING ARRANGEMENT

CROSS-REFERENCE TO RELATED APPLICATIONS

This application is a 371 U.S. National Stage of International Application No. PCT/SE2019/050982, filed Oct. 8, 2019, which claims priority to Swedish Patent Application No. 1851329-1, filed Oct. 26, 2018. The disclosures of each of the above applications are incorporated herein by reference in their entirety.

FIELD OF THE INVENTION

The present invention relates to a biometric imaging arrangement configured to be arranged under an at least partially transparent display panel. The invention further relates to an electronic device.

BACKGROUND OF THE INVENTION

Biometric systems are widely used as means for increasing the convenience and security of personal electronic devices, such as mobile phones etc. Fingerprint sensing systems, in particular, are now included in a large proportion of all newly released consumer electronic devices, such as mobile phones.

Optical fingerprint sensors have been known for some time and may be a feasible alternative to e.g. capacitive fingerprint sensors in certain applications. Optical fingerprint sensors may for example be based on the pinhole imaging principle and/or may employ micro-channels, i.e. collimators or microlenses to focus incoming light onto an image sensor.

It has recently been of interest to arrange optical fingerprint sensors under the display of electronic devices. In order to fit the optical fingerprint sensor under the display the image distance is required to be small to reduce the thickness of the optical fingerprint sensor. Furthermore, the object to be imaged, i.e. a fingerprint, is often located at a distance from the sensor which is significantly larger than the image distance. This object distance is often defined by at least the display thickness including screen protectors etc.

The requirements on the image distance and object distance leads to that the pixel size of the image sensor have to be small to maintain a high resolution which requires relatively costly image sensors.

US2016/0266695 describes a fingerprint-sensing display capable of sensing a fingerprint on a display screen. US2016/0266695 discloses that color filter material of a specific wavelength band has been deposited on some of the pixels of an optical sensor array. A first image is acquired using the colored pixels and a second image is acquired using the non-colored pixels. Finally, the images are combined to produce an image with higher resolution.

Although it appears that US2016/0266695 discloses a way to increase the resolution by not reducing the pixel size, there is still room for improvements in this regard.

SUMMARY

In view of above-mentioned and other drawbacks of the prior art, it is an object of the present invention to provide a biometric imaging arrangement with improved imaging resolution.

According to a first aspect of the invention, there is provided an optical biometric imaging arrangement configured to be arranged under an at least partially transparent display panel and configured to capture an image of an object located on an opposite side of the transparent display panel.

The biometric imaging arrangement comprises an image sensor comprising a photodetector pixel array.

The biometric imaging arrangement comprises an array of light redirecting elements. Each light redirecting element is configured to redirect light onto the photodetector pixel array, A color filter is arranged between the array of light redirecting elements and the image sensor. The color filter comprises at least two color filter arrays of respective color filter elements being optically transmissive. A first color array comprising first color filter elements and a second color array comprising second color filter elements.

The color filter arrays are arranged such that each photodetector pixel of the image sensor is at least partly covered by at least a first color filter element and a second color filter element.

The present invention is based on the realization to cover each pixel of the photodetector pixel array by at least two different color filter elements. E.g. at least a first color filter element and a second color filter element. The different color filter elements are configured to filter out light of wavelengths outside of the respective transmission band of the specific color filter element.

Accordingly, each of the color filters has a spectral transmission band corresponding to a color of light, e.g. a first color and a second color. In this way it is possible to acquire at least two images, one in a first spectral band and another in a second spectral band, etc., and subsequently combine the images. This means that each pixel in the array of photodetector pixel acquires image data for at least two images. Effectively, the sampling frequency (the "dpi"), of the image sensor comprising the photodetector pixel array is increased, for a given image sensor.

By means of the claimed invention, a biometric imaging arrangement is provided which is readily integrated in a display panel to provide in-display fingerprint sensing functionality, and where the image device sampling frequency and resolution may be improved without replacing the image sensor to a more costly sensor with smaller pixels. By using multiple exposures in different spectral bands, the resolution and sampling frequency can be increased without replacing the image sensor.

The color filter may comprise a set of color filter arrays, where each of the arrays is configured to allow the transmission of light in a specific spectral band. In other words, the color filter elements of the respective color filter array are configured for a respective spectral transmission band.

The entire area of the color filter elements may be optically transmissive. In other words, the entire first color filter element and the entire second color filter element may be optically transmissive.

The color filter is provided in the form of a color filter layer on the image sensor, either directly or in-directly on the pixels, i.e. there may be e.g. protective layers in between if so needed. However, the color filter is arranged so that each photodetector pixel is at least partly covered by one color filter element from each of the color filter arrays.

That each photodetector pixel of the image sensor is at least partly covered by one color filter element from each of the color filter arrays, i.e. by at least a first color filter element and a second color filter element, means that the photodetector pixel only receives light that has been filtered through the color filter elements.

The outer surface of a display panel under which the biometric imaging arrangement is arranged may also be referred to as a sensing surface. The operating principle of the described biometric imaging arrangement is that light emitted by pixels in the display panel will be reflected by a finger placed on the sensing surface, and the reflected light is received by the light redirecting elements and subsequently redirected onto a corresponding subarray of pixels or a single pixel in the photodetector pixel array. In case of a subarray, an image of a portion of a finger can be captured for each subarray. By combining the images from all of the light redirecting elements, an image representing the fingerprint can be formed and subsequent biometric verification can be performed.

According to embodiments, the image sensor may preferably be a thin-film transistor (TFT) based image sensor. Such sensors provide a cost-efficient solution for under display fingerprint imaging sensors. The TFT image sensor may be a back illuminated TFT image sensor or a front illuminated TFT image sensor. The TFT image sensor may be arranged as a Hot-zone, Large Area or Full display solution.

According to embodiments, each photodetector pixel of the image sensor may be partly covered by opaque portions. The opaque portions, i.e. non-transparent portions, are arranged to block parts of the photodetector pixels from receiving light. This effectively reduces the active area of the pixels but advantageously improves the modulation transfer function (MTF) of the image sensor. The opaque portions may further be used for improving image sensor symmetry.

According to embodiments, the areas of each photodetector pixel which is covered by respective color filter elements, and not covered by opaque portions, may be equal. In other words, the areas of the photodetector pixel which are configured to receive filtered light from the respective color filter element from each color filter array are equal. Thus, the effective pixel size provided by the combination of a first color filter element and the overlapping pixel area, and the effective pixel size provided by the combination of a second color filter element and the overlapping pixel area are equal. This provides for a straight forward configuration of the color filter and the opaque portions, for example when no symmetry is needed to compensated for.

According to embodiments, the areas of each photodetector pixel covered by a respective first color filter element and second color filter element, and not covered by opaque portions, may be different. In this way, as mentioned, the image sensor asymmetry may be adjusted for. In addition, variations in the spectral band transmissivity between the different spectral bands of the color filter arrays may be compensated for.

According to embodiments, the biometric arrangement may comprise an opaque mask layer arranged to cover portions of each of the color filter elements to thereby define opaque portions and optically transmissive color filter portions. This is one possible way of realizing the opaque portions in combination with the color filter elements of the color filter arrays. The color filter portions are the portions of the color filter elements that are not covered by the opaque mask layer and that are arranged to cover at least a portion of a photodetector pixel.

According to embodiments, the opaque portions are arranged in the same layer as the optically transmissive color filter elements. Accordingly, the opaque portions are advantageously arranged in a side-by-side manner with the color filter elements. This provides for an even surface formed by the opaque portions and the color filter elements facing away from the image sensor which may facilitate assembly of the biometric imaging arrangement. Furthermore, the overall height of the biometric sensing arrangement is made lower by arranging the opaque portions and the color filter elements side-by-side. It also provides for simplified manufacturing.

According to embodiments, the transparent display panel may comprise a color controllable light source. Various types of displays can be used in accordance with embodiments. For example display panels based on OLED, u-LED with any type of tri-stimulus emission like RGB, CMY or others.

In any case, it is important that the color filters applied onto the image sensor pixels are selected to match the spectral bands of the light emitted by the display.

According to embodiments, the spectral transmission band of the color filter elements in each of the color arrays are configured to match a respective color of the emitted light from the color controllable light source.

The spectral transmission bands of color filter elements in different color arrays are preferably at least partly separated. The spectral transmission bands are preferably centered at separate transmission wavelengths.

According to embodiments, the array of light redirecting elements may be an array of microlenses. Microlenses provide an advantageous way to redirect light onto the photodetector pixel array. In particular, each is microlens may be arranged to redirect light onto a subarray of pixels.

According to embodiments, the array of microlenses may be arranged on a transparent substrate arranged to cover the image sensor. This simplifies the manufacturing of the biometric imaging device since the microlenses may all be manufactured on the same transparent substrate. Further, having all the microlenses arranged on a single substrate facility the task of getting the microlenses in a single plane.

According to embodiments, the biometric sensing arrangement may comprise an opaque layer arranged to cover an upper surface of the transparent substrate. The opaque layer further comprises a plurality of separate openings, wherein each of the microlenses is located in a respective opening in the opaque layer. This advantageously ensures that limited stray light is detected by the image sensor, i.e. it prevents light reaching the image sensor that has not passed thought a microlens.

The microlenses may be arranged in an array having a pitch in the range of 50 μm to 2 mm.

The microlenses may be circular lenses having a diameter in the range of 20 μm to 1 mm.

The microlenses may be rectangular lenses having a length of a shortest side in the range of 20 μm to 1 mm.

Moreover, the microlens may have a height in the range of 2 μm to 600 μm.

With the above described possible configurations of the plurality of microlenses, an optical fingerprint senor for use under a display panel can be provided, and the specific configuration can be adapted based on the properties of the display panel and on the requirements for the application at hand.

According to embodiments, the color filter is preferably sandwiched between the image sensor and the transparent substrate.

According to embodiments, the biometric imaging arrangement may comprise: a transparent substrate arranged to cover the image sensor; wherein the light redirecting elements is a transmission mask arranged to cover the transparent substrate, wherein the transmission mask comprises a plurality of openings forming a coded aperture configured to project a coded image of an object in contact with the outer surface of the biometric imaging arrangement onto the image sensor; and image sensor circuitry configured to capture an image corresponding to the coded image projected onto the image sensor.

According to embodiments, the array of light redirecting elements may be an array of collimators each arranged to redirect light onto one pixel in the photodetector pixel array.

According to a second aspect of the invention, there is provided an electronic device comprising: a transparent display panel and the optical biometric imaging arrangement according to any one of the embodiments of the first aspect of the invention. The electronic device further comprises processing circuitry configured to receive a signal from the optical biometric imaging arrangement indicative of a fingerprint of a finger touching the transparent display panel, and to perform a fingerprint authentication procedure based on the detected fingerprint.

The display panel may for example be based on OLED, LCD, μLED and similar technologies. Thereby, in-display biometric imaging is enabled.

The electronic device may be e.g. a mobile device such as a mobile phone (e.g. Smart Phone), a tablet, a phablet, etc.

Further effects and features of the second aspect of the invention are largely analogous to those described above in connection with the first aspect of the invention.

According to a third aspect of the invention, there is provided a method for acquiring a fingerprint image using an optical biometric imaging arrangement arranged under an at least partially transparent display panel comprising a color controllable light source, the method comprises sequentially illuminating a finger with light of a different colors. The method further comprises capturing a respective color filtered fingerprint image for each of the different colors, and combining the color filtered fingerprint images to form a resulting fingerprint image.

According to embodiments, the method may comprise illuminating a finger with light of a first color; capturing a first color filtered fingerprint image; illuminating the finger with light of a second color; capturing a second color filtered fingerprint image; and combining the first color filtered fingerprint image and the second color filtered fingerprint image to form a resulting fingerprint image.

Further effects and features of the third aspect of the invention are largely analogous to those described above in connection with the first aspect and the second aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein:

FIG. 11 schematically illustrates a biometric imaging arrangement according to an embodiment of the invention.

DETAILED DESCRIPTION OF EXAMPLE EMBODIMENTS

In the present detailed description, various embodiments of the biometric imaging arrangement according to the present invention are mainly described with reference to a biometric imaging arrangement arranged under a display panel. However, it should be noted that the described imaging device also may be used in other optical fingerprint imaging applications such as in an optical fingerprint sensor located under a cover glass or the like.

Figure 1:
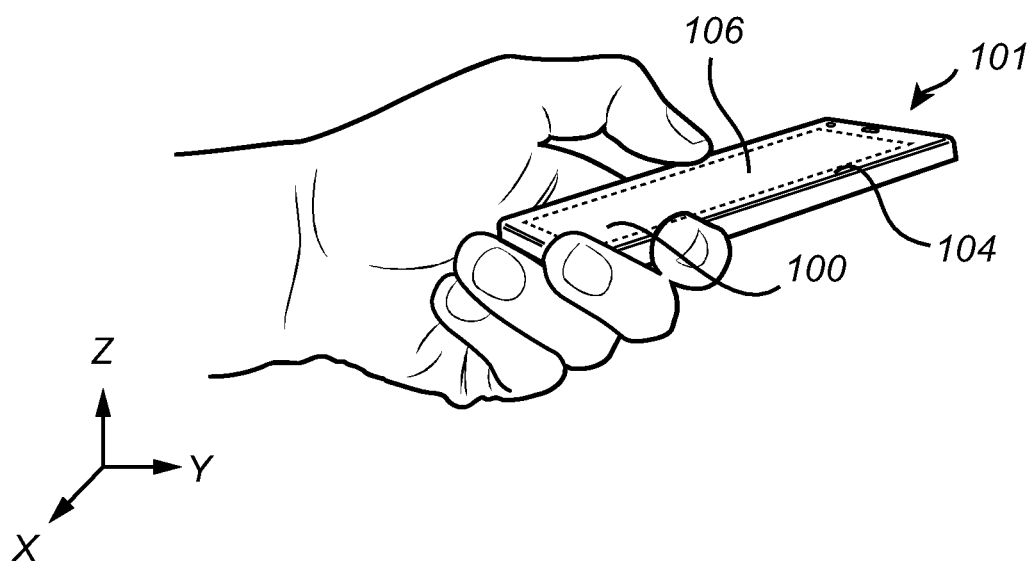
FIG. 1 schematically illustrates an example of an electronic device according to embodiments of the invention.

Turning now to the drawings and in particular to FIG. 1, there is schematically illustrated an example of an electronic device configured to apply the concept according to the present disclosure, in the form of a mobile device 101 with an integrated in-display biometric imaging arrangement 100 and a display panel 104 with a touch screen interface 106. The biometric imaging arrangement 100 may, for example, be used for unlocking the mobile device 100 and/or for authorizing transactions carried out using the mobile device 100, etc.

The biometric imaging arrangement 100 is here shown to be smaller than the display panel 104, but still relatively large, e.g. a large area implementation, In another advantageous implementation the biometric imaging arrangement 100 may be the same size as the display panel 104, i.e. a full display solution. Thus, in such case the user may place his/her finger anywhere on the display panel for biometric authentication. The biometric imaging arrangement 100 may in other possible implementations be smaller than the depicted biometric imaging arrangement, such as providing a hot-zone implementation.

Preferably and as is apparent for the skilled person, the mobile device 100 shown in FIG. 1 further comprises a first antenna for WLAN/Wi-Fi communication, a second antenna for telecommunication communication, a microphone, a speaker, and a phone control unit. Further hardware elements are of course possibly comprised with the mobile device.

It should furthermore be noted that the invention may be applicable in relation to any other type of electronic devices comprising transparent display panels, such as a laptop, a tablet computer, etc.

Figure 2:
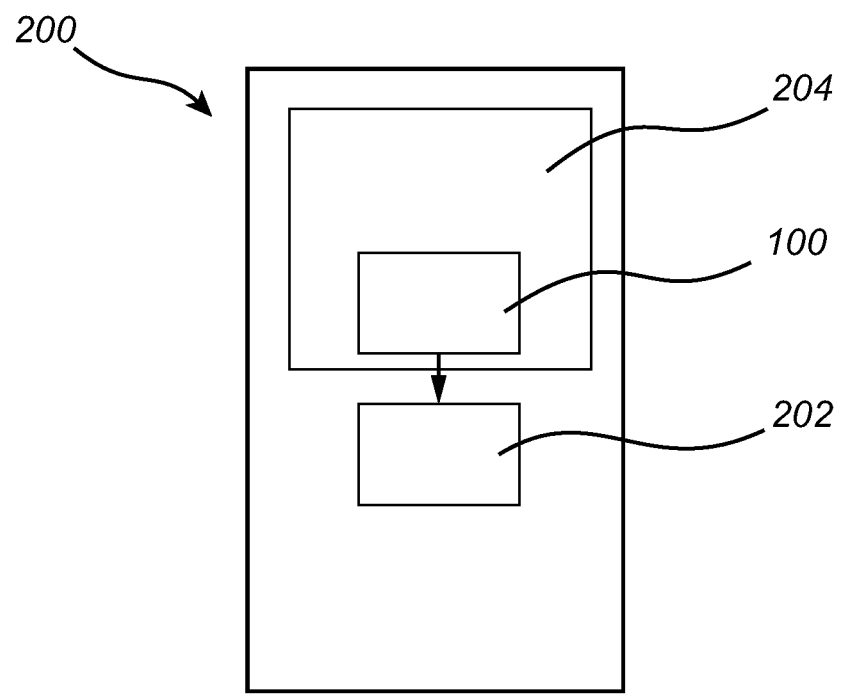
FIG. 2 is a schematic box diagram of an electronic device according to embodiments of the invention.

FIG. 2 is a schematic box diagram of an electronic device according to embodiments of the invention. The electronic device 200 comprises a transparent display panel 204 and a biometric imaging arrangement 100 conceptually illustrated to be arranged under the transparent display panel 204 according to embodiments of the invention. Furthermore, the electronic device 200 comprises processing circuitry such as control unit 202. The control unit 202 may be stand-alone control unit of the electronic device 202, e.g. a device controller. Alternatively, the control unit 202 may be comprised in the biometric imaging arrangement 100.

The control unit 202 is configured to receive a signal indicative of a detected object from the biometric imaging arrangement 100. The received signal may comprise image data.

Based on the received signal the control unit 202 is configured to detect a fingerprint, and based on the detected fingerprint the control unit 202 is configured to perform a fingerprint authentication procedure. Such fingerprint authentication procedures are considered per se known to the skilled person and will not be described further herein.

Figure 3:
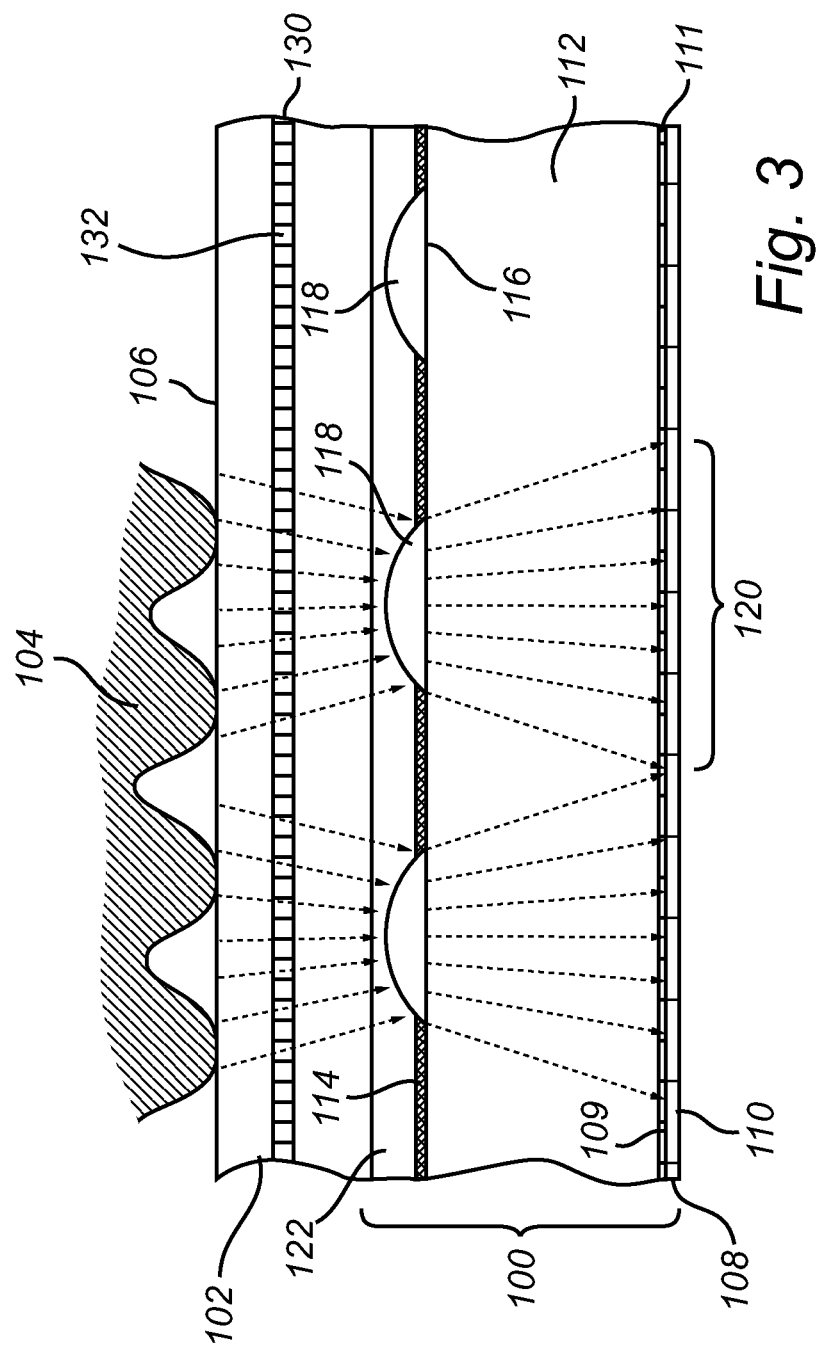
FIG. 3 schematically illustrates a biometric imaging arrangement according to an embodiment of the invention.

FIG. 3 schematically illustrates a biometric imaging arrangement 100 according to an embodiment of the invention. The biometric imaging arrangement 100 is here arranged under an at least partially transparent display panel 102. However, the biometric imaging arrangement 100 may be arranged under any cover structure which is sufficiently transparent, as long as the image sensor receives a sufficient amount of light to capture an image of a biometric object in contact with the outer surface of the cover structure, such as a fingerprint or a palmprint. In the following, a biometric imaging arrangement 100 configured to capture an image of a finger 104 in contact with an outer surface 106 of the display panel 102 is described.

The biometric imaging arrangement 100 comprises an image sensor 108 comprising a photodetector pixel array 109, where each pixel 110 is an individually controllable photodetector configured to detect an amount of incoming light and to generate an electric signal indicative of the light received by the detector. The image sensor 108 may be any suitable type of image sensor, such as a CMOS or CCD sensor connected to associated control circuitry. However, in a preferred embodiment image sensor 108 is a thin-film transistor (TFT) based image sensor which provides a cost-efficient solution. The operation and control of such an image sensor can be assumed to be known and will not be discussed herein.

The biometric imaging arrangement 100 further comprises a transparent substrate 112 arranged to cover the image sensor 108, an opaque layer 114 covering an upper surface of the transparent substrate 112. The opaque layer 114 further comprises a plurality of separate openings 116 arranged at a distance from each other.

The biometric imaging arrangement comprises an array of microlenses 118 each arranged in a respective opening 116 of the optional opaque layer 114 and in the same plane as the opaque layer 114. Moreover, the microlens 118 has the same size and shape as the opening 116 to prevent any stray light which has not passed through the microlens 118, 119 from reaching the image sensor 108.

Each microlens 118 is configured to redirect light through the transparent substrate 112 and onto a subarray 120 of pixels in the photodetector pixel array 109. The subarrays 120 are here defined as arrays of pixels which receive light from only one microlens 118. It should further be noted that the microlenses 118 and display pixels are not drawn to scale. The microlens 118 is shown to receive light reflected by the finger 104 which has propagated through the display panel 102 before reaching the microlens 118 and the light received by the microlens 118 is focused onto the image sensor 108. The sub-arrays 120 of pixels receiving light from the microlenses 118 are preferably non-overlapping with adjacent subarrays receiving light from neighboring microlenses.

Figure 4:
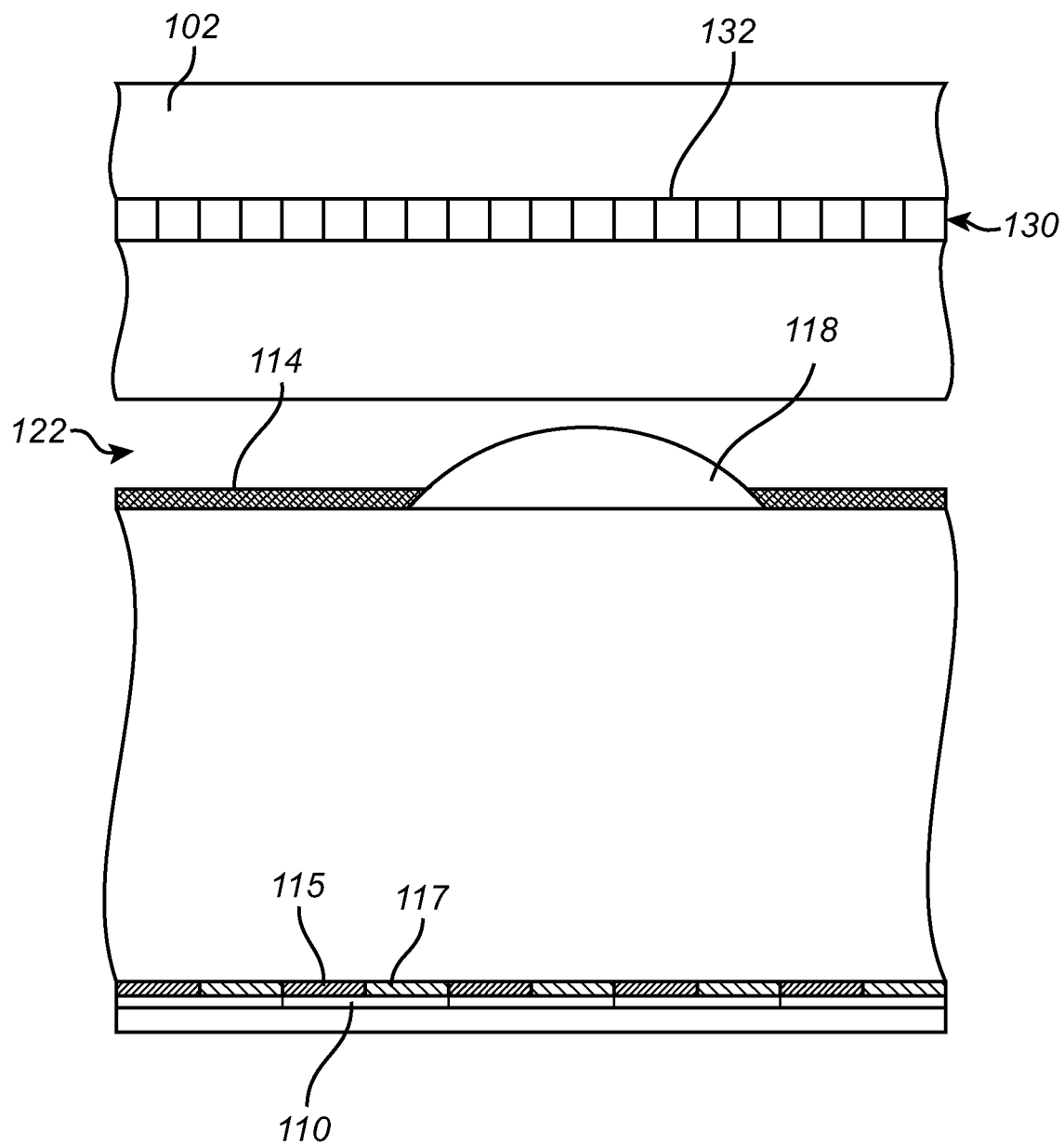
FIG. 4 schematically illustrates a close up view of the biometric imaging arrangement in FIG. 3.

The biometric imaging arrangement 100 further comprises a color filter 111 arranged between the array of microlenses 118 and the image sensor 108. As can be more clearly seen in FIG. 4, the color filter array 111 comprises a first color array of first color filter elements 115 and a second color array of second color filter elements 117. A first color filter 115 element and a second color filter element 117 are arranged to cover each photodetector pixel 110 of the image sensor.

Moreover, the transparent display panel 102 comprises a color controllable light source 130 comprising individually controllable light emitting pixels 132. For acquiring an image of e.g. a fingerprint or palmprint, the color controllable light source 130 may emit light that is reflected by the finger 104 and detected by the pixels of the image sensor 110. The emitted light has a predetermined color that matches the spectral transmission band of the color filter elements of one color, e.g. the first color filter elements 115. In this way, the pixel 110 predominantly receives light through the first color filter elements 115 and not through the second color filter elements 117 since the second color filter elements 117 filters away light of the first color.

Subsequently, the color controllable light source 130 may emit light of a predetermined color that matches the spectral transmission band of the second color filter elements 117. Thereby the pixel 110 predominantly receives light through the second color filter elements 117 and not through the first color filter element 115 since the first color filter elements 115 filters away light of the second color.

There are suitable openings or optical paths past the color controllable light source 130 so that the light beams being transmitted from the finger 104 to reach the image sensor 108.

In other possible implementations a color controllable light source may be arranged on the side of the transparent panel wherein light guides or a cover glass are configured to guide light from the color controllable light source to the image sensor area for the detection of a fingerprint.

The biometric imaging arrangement 100 further comprises an intermediate layer 122 located between the opaque layer 114 and the display panel 102. The intermediate layer 122 may for example comprise an adhesive layer used to attach the display panel 102 to the imaging device 100, and a refractive index of the intermediate layer 122 is different from a refractive index of the microlens 118. The intermediate layer comprises an air gap between the transparent display panel and the microlenses 118.

Furthermore, the intermediate layer 122 may also comprise an antireflection coating, an optical filter (e.g. infrared filter) and/or a polarizing filter, which are not illustrated separately herein. It is in general preferable that the refractive index of the microlens 118 is as high as possible and that it is different from the refractive index of any adjacent material above or below the microlens 118.

Figure 5:
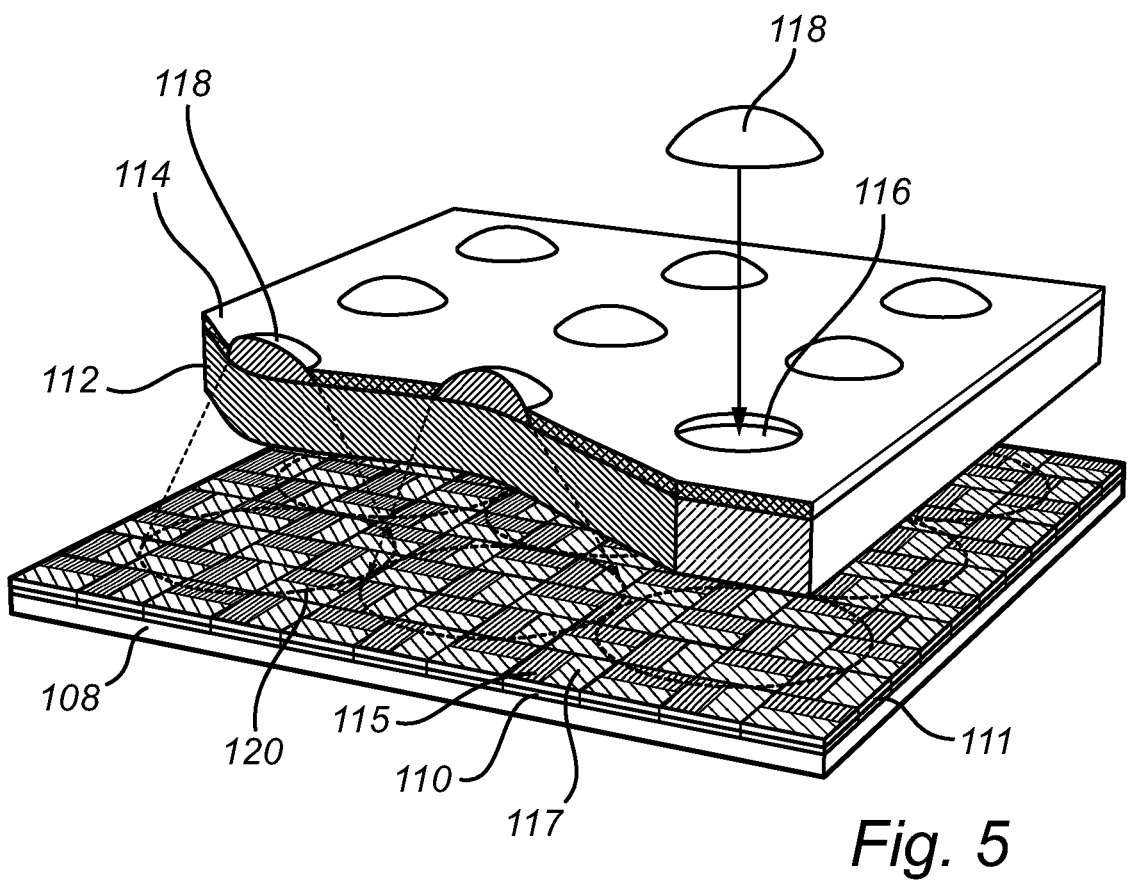
FIG. 5 is exploded view of a biometric imaging arrangement according to an embodiment of the invention.

FIG. 5 is an exploded view of the biometric imaging arrangement 100 more clearly illustrating the subarrays 120 of pixels in the pixel array 109 receiving light from one microlens 118. Each pixel 110 is covered by a first color filter 115 element and a second color filter element 117. The microlenses 118 are here shown as circular microlenses thus providing a circular subarray 120. Other shapes of the microlenses are however conceivable such as rectangular microlenses.

FIGS. 6a-e illustrates different layout of the color filter elements according to various embodiments. The embodiments shown in in FIGS. 6a-e each relate to embodiments having color filter elements of two colors, a first color and a second color. The invention is however applicable to having more than two types of color filter elements of more than two colors.

Figure 6A:
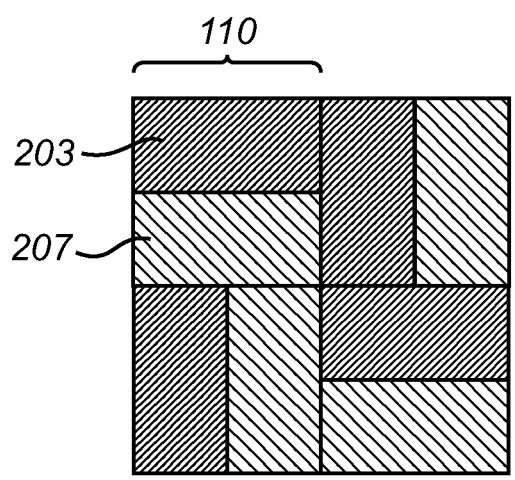
FIGS. 6a-e conceptually illustrates different configurations of color filter elements arranged on photodetector pixels.

In FIG. 6a, four image sensor photodetector pixels of which one is numbered 110 is shown each being covered by a respective first color element 203 and a second color element 207. The color elements 203 and 207 are here covering the entire photodetector pixel 110. In this example embodiment, the areas of the first color element 203 and the second color element 207 are equal. Furthermore, in the example embodiment of FIG. 6a, the entire photodetector pixel 110 is used which means no spatial image information is lost between neighboring pixels. However, the image signal captured with the pixel portion covered by the respective color filter element 203, 207 is averaged across a larger pixel area. More precisely, the signal captured by the pixel 110 corresponding to light that has been filtered by one of the filter elements 203 or 207 is averaged over the entire pixel area 110.

Figure 6B:
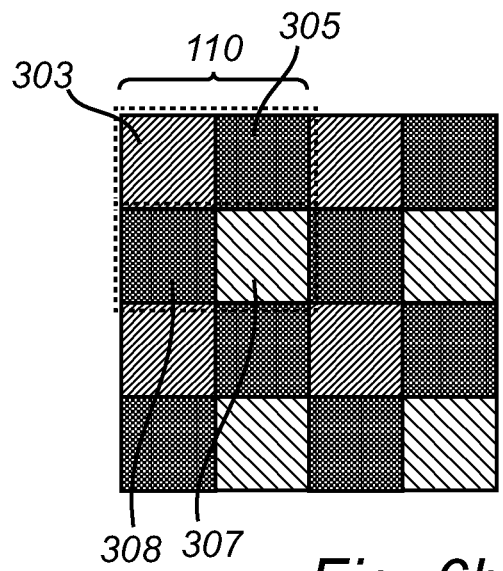

FIG. 6b illustrates a further embodiment in which the photodetector pixel 110 is covered by filter color elements 303 and 307 and opaque portions 305 and 308. The first color element 303 is adapted to filter the incoming light so that the filtered light reaches the photodetector pixel 110. Similarly, the second color element 307 is adapted to filter the incoming light so that the filtered light reaches the photodetector pixel 110. In this example embodiment, the areas of the color filter elements 303 and 307 are equal to the areas of the opaque portions 305 and 308. Further, in this example embodiment it is noted that no spatial information is lost in the diagonal direction across the array of photodetector pixels 110 since the optically transmissive filter elements 303 and 307 are not diagonally separated by any opaque portions. Moreover, the areas of the optically transmissive filter elements 303 and 307 that are not covered by any opaque portions are equal in the embodiment shown in FIG. 6b.

Figure 6C:
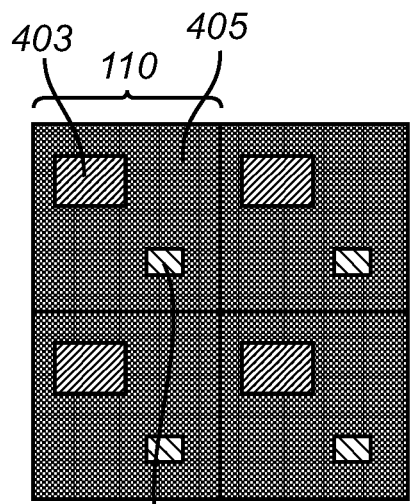

FIG. 6c describes another possible implementation where each photodetector pixel is partly covered by the filter color elements 403 and 407 and an opaque portion 405. Contrary to the embodiment shown in FIG. 6c, the areas of the optically transmissive filter color elements 403 and 407 that are not covered by opaque portions are not equal in this embodiment. Here the filter element 403 is larger than the filter element 407. By tailoring the relative size of the optically transmissive color filter elements 403 and 407 it is possible to compensate for different sensitives of the pixel 110 to different spectral bandwidths or the transmissivity of the filters of different colors. For example, if the image sensor photodetector pixel 110 is more sensitive to light of the first color than to light of the second color, the area of the second color filter element 407 can be made larger than the area of the first color filter element 403. As a further example, if the strength of the light emitted by the color controllable light source various over different spectral bands, this may be compensated for by making the areas of the color filter elements different using opaque portions.

The embodiments discussed in relation to FIGS. 6b and 6c both comprise opaque portions which makes the effective image sensor pixel sixe smaller. This advantageously increases the image sensor modulation transfer function (MTF) although the image sensor sensitivity is reduced.

Figure 6D:
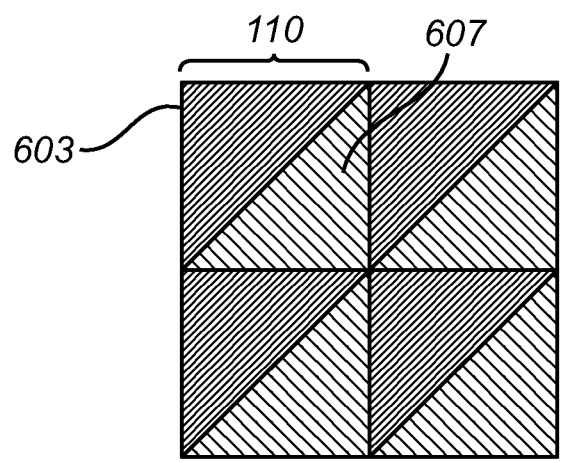

The color filter elements have so far only been shown to be rectangular. However, as indicated in FIG. 6d, other shapes are conceivable. In FIG. 6d, the first color filter element 603 and the second color filter element 607 are triangular.

Figure 6E:
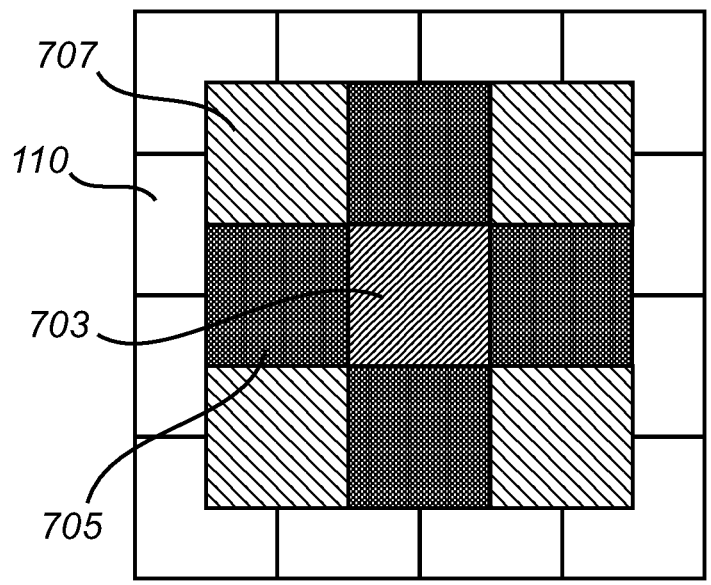

Furthermore, the color filter elements may also be arranged to cover more than one photodetector pixel element 110. Turning to FIG. 6e, there is shown a first color filter element 703 arranged to partly cover four photodetector pixels 110, and a second color filter element 707 arranged to partly cover four photodetector pixels 110. There is also an opaque portion 705 arranged to partly cover four photodetector pixels 110.

Figure 7A:
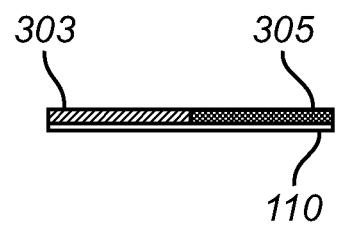
FIGS. 7a-b are schematic cross-sectional views of a color filter element, an opaque portions and a photodetector pixel.
Figure 7B:
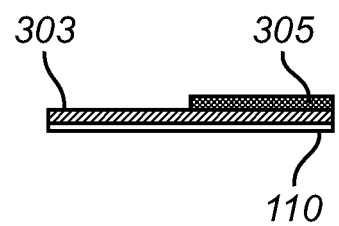

Forming the opaque portions may be achieved in various ways. FIG. 7a-b illustrates two possible implementations. FIGS. 7a and 7b each illustrates a cross-section of a pixel 110, a color filter element 303 (e.g. from FIG. 6b) and an opaque portion 305.

In FIG. 7a, the opaque portion 305 are arranged in the same layer as the optically transmissive color filter elements, and in FIG. 7b an opaque mask layer arranged to cover portions of each of the color filter elements to thereby define opaque portions 305 and optically transmissive color filter portions. The opaque mask layer thus covers part of the color filter element 303 so that an opaque portion 305 is defined on the color filter element 303.

Figure 8:
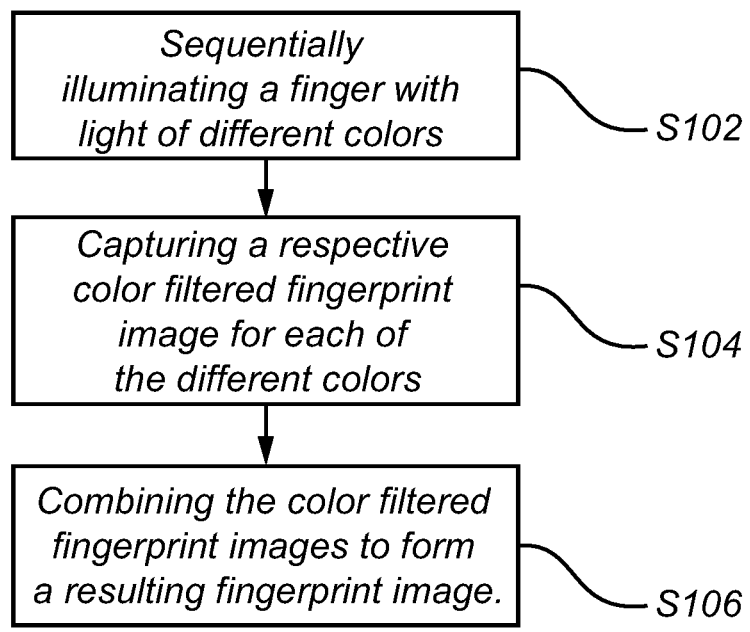
FIG. 8 is a flow-chart of method steps according to embodiments of the invention.

FIG. 8 is a flow-chart of method steps according to embodiments. A finger is sequentially illuminates with light of different color as indicated in step S102. For each illumination, a respective color filtered fingerprint image for each of the different colors is captured in step S104. Subsequently, the color filtered fingerprint images are combined to form a resulting fingerprint image in step S106.

Figure 9:
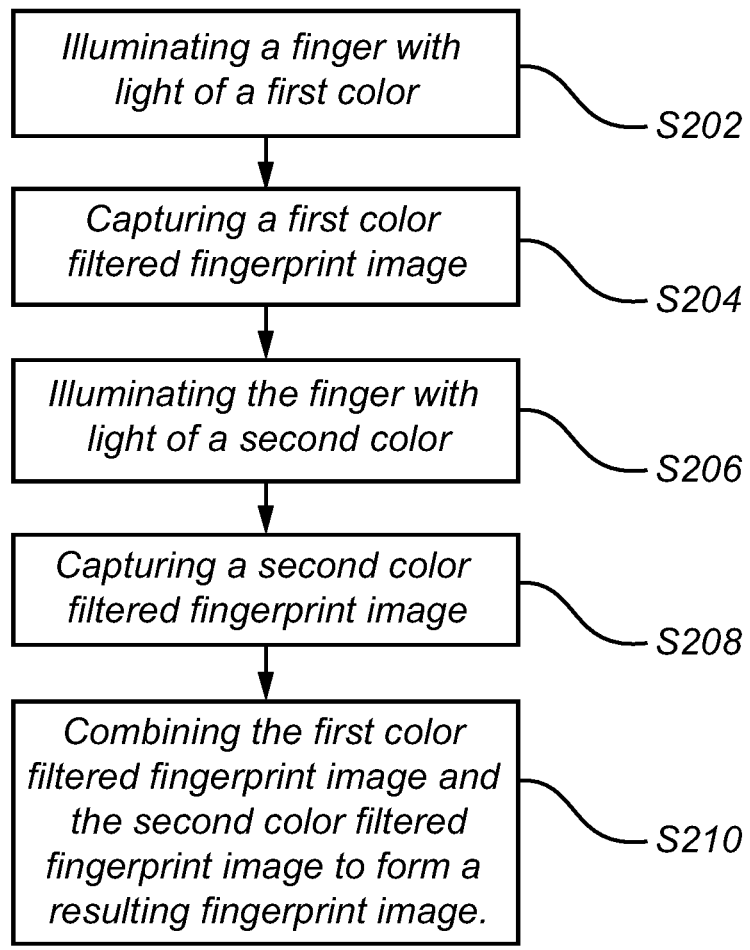
FIG. 9 is a flow-chart of method steps according to embodiments of the invention.

FIG. 9 is a flow-chart of method steps according to a more specific embodiment. Here the finger is first S202 illuminated with light of a first color. Next S204, a first color filtered fingerprint image is captured. Illuminating S206 the finger with light of a second color, and subsequently, capturing S208 a second color filtered fingerprint image. The first color filtered fingerprint image and the second color filtered fingerprint image are combined in step S210 to form a resulting fingerprint image.

The combination of the filtered fingerprint images may be performed by known imaging combination techniques. In examples with opaque portions, the image signal may be interpolated across the photodetector pixel area in order to include the mask-out portions. One masked-out portion may for example be represented by the average of neighboring non-masked portions (i.e. color filter portions).

In cases with no opaque portions, the image signals from the respective color filter element portions may be used directly, although other possible ways of combining the image signals are conceivable.

Manufacturing of the color filter elements may be performed by production techniques known per se. Such manufacturing techniques include e.g. spinning of liquid based filter products, e.g. a dye dissolved in a carrier liquid. Processing of the spun filter product enables defining the color filter elements on the surface of the image sensor by known lithographic processes such as photolithography. Other processing techniques and materials for the color filter elements are conceivable, such as filter products comprising pigments on a carrier, or suspended in a carrier liquid.

Figure 10:
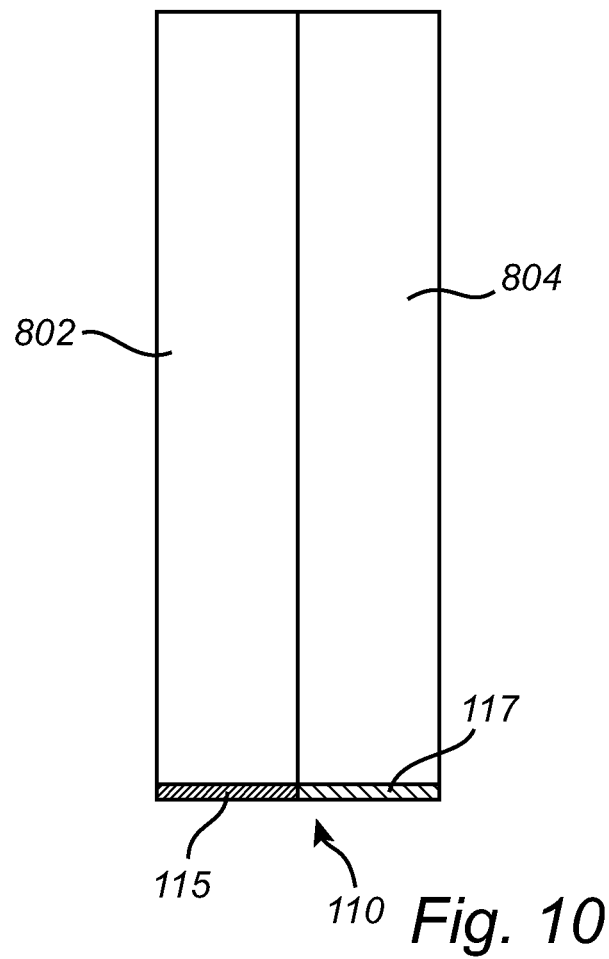
FIG. 10 illustrates an embodiment of the invention where the light directing elements are collimators.

In some possible implementations the array of microlenses may be replaced by an array of collimators. FIG. 10 conceptually illustrates one photodetector pixel 110 of the image sensor. The photodetector pixel 110 is covered by two color filter elements, a first color filter element 115 and a second color filter element 117, as in the previously described embodiments. A first collimator 802 is configured to redirect light to towards the first color filter element 115 and a second collimator 804 is configured to redirect light to towards the second color filter element 115.

In further possible implementations, the light guiding elements are comprised of an array of coded aperture elements, as is illustrated in FIG. 11 showing a cross-section thereof. Similar to the embodiment illustrated in FIG. 3, a transparent substrate 112 is arranged to cover the image sensor 108 and the color filter 111. A transmission mask 206 is arranged to cover the transparent substrate 112. Furthermore, the transmission mask 206 comprises a plurality of openings 208 forming a coded aperture configured to project a coded image of an object 104 in contact with the outer surface of the biometric imaging arrangement 100 onto the image sensor 108. Image sensor circuitry (not shown) is configured to capture an image corresponding to the coded image projected onto the image sensor.

Coded aperture imaging is based on the principle of blocking the incoming light in a known pattern so that a coded shadow is cast upon the image sensor. The properties of the originally emitted light, i.e. the light reaching the coded aperture, can then be mathematically reconstructed from this shadow image.

A control unit may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device. It should be understood that all or some parts of the functionality provided by means of the control unit (or generally discussed as "processing circuitry") may be at least partly integrated with the biometric imaging arrangement.

Even though the invention has been described with reference to specific exemplifying embodiments thereof, many different alterations, modifications and the like will become apparent for those skilled in the art. Also, it should be noted that parts of the imaging device and method for manufacturing the imaging device may be omitted, interchanged or arranged in various ways, the imaging device yet being able to perform the functionality of the present invention.

The microlenses are herein illustrated as plano-convex lenses having the flat surface orientated towards the transparent substrate. It is also possible to use other lens configurations and shapes. A plano-convex lens may for example be arranged with the flat surface towards the display panel, and in one embodiment the lens may be attached to a bottom surface of the display panel even though the imaging performance may be degraded compared to the reverse orientation of the microlens. It is also possible to use other types of lenses such as convex lenses. An advantage of using a plano-convex lens is the ease of manufacturing and assembly provided by a lens having a flat surface.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. An optical biometric imaging arrangement configured to be arranged under an at least partially transparent display panel and configured to capture an image of an object located on an opposite side of the transparent display panel, the biometric imaging arrangement comprising:
an image sensor comprising a photodetector pixel array;
an array of light redirecting elements, wherein each light redirecting element is configured to redirect light onto the photodetector pixel array,
a color filter arranged between the array of light redirecting elements and the image sensor, the color filter comprising at least two color filter arrays of respective color filter elements being optically transmissive, a first color array comprising first color filter elements and a second color array comprising second color filter elements,
wherein the color filter arrays are arranged such that each photodetector pixel of the image sensor is at least partly covered by at least a first color filter element and a second color filter element.

2. The optical biometric imaging arrangement according to claim 1, wherein the image sensor is a thin-film transistor image sensor.

3. The optical biometric imaging arrangement according claim 1, wherein each photodetector pixel of the image sensor is partly covered by opaque portions.

4. The optical biometric imaging arrangement according to claim 3, wherein the areas of each photodetector pixel which is covered by respective color filter elements, and not covered by opaque portions, are equal.

5. The optical biometric imaging arrangement according to claim 3, wherein the areas of each photodetector pixel covered by a respective first color filter element and second color filter element, and not covered by opaque portions, are different.

6. The optical biometric imaging arrangement according to claim 3, comprising an opaque mask layer arranged to cover portions of each of the color filter elements to thereby define opaque portions on each color filter element.

7. The optical biometric imaging arrangement according to claim 3, wherein the opaque portions are arranged in the same layer as the optically transmissive color filter elements.

8. The optical biometric imaging arrangement according to claim 1, wherein the layout of the first color filter element and the layout of the second color filter element on the photodetector pixels are repeated through-out the photodetector pixel array.

9. The optical biometric imaging arrangement according to claim 1, wherein the transparent display panel comprises a color controllable light source.

10. The optical biometric imaging arrangement according to claim 9, wherein the spectral transmission band of the color filter elements in each of the color arrays are configured to match a respective color of the emitted light from the color controllable light source.

11. The optical biometric imaging arrangement according to claim 9, wherein spectral transmission bands of color filter elements in different color arrays are at least partly separated.

12. The optical biometric imaging arrangement according to claim 1, wherein the color filter is sandwiched between the image sensor and a transparent substrate.

13. The optical biometric imaging arrangement according to claim 1, wherein the array of light redirecting elements is an array of microlenses.

14. The optical biometric imaging arrangement according to claim 13, wherein each microlens is arranged to redirect light onto a subarray of pixels in the photodetector pixel array.

15. The optical biometric imaging arrangement according to claim 13, wherein the array of microlenses is arranged on the transparent substrate which is arranged to cover the image sensor.

16. The optical biometric imaging arrangement according to claim 13, comprising an opaque layer covering an upper surface of the transparent substrate, wherein the opaque layer further comprises a plurality of separate openings, wherein each of the microlenses is located in a respective opening in the opaque layer.

17. The optical biometric imaging arrangement according to claim 1, comprising:
   a transparent substrate arranged to cover the image sensor;
   wherein the light redirecting elements is a transmission mask arranged to cover the transparent substrate, wherein the transmission mask comprises a plurality of openings forming a coded aperture configured to project a coded image of an object in contact with the outer surface of the biometric imaging arrangement onto the image sensor; and
   image sensor circuitry configured to capture an image corresponding to the coded image projected onto the image sensor.

18. The optical biometric imaging arrangement according to claim 1, wherein the array of light redirecting elements is an array of collimators each arranged to redirect light onto one pixel in the photodetector pixel array.

19. An electronic device comprising:
   a transparent display panel;
   the optical biometric imaging arrangement according to claim 1, and
   processing circuitry configured to:
      receive a signal from the optical biometric imaging arrangement indicative of a fingerprint of a finger touching the transparent display panel,
      perform a fingerprint authentication procedure based on the detected fingerprint.

20. A method for acquiring a fingerprint image using an optical biometric imaging arrangement arranged under an at least partially transparent display panel comprising a color controllable light source and a photodetector pixel array, wherein each pixel is at least partly covered by at least a first color filter element and a second color filter element, the method comprising:
   sequentially illuminating a finger with light of a different color that matches the spectral transmission band of a respective color filter element;
   capturing, using the photodetector pixel array, a respective color filtered fingerprint image for each of the different colors; and
   combining the color filtered fingerprint images to form a resulting fingerprint image.

* * * * *